United States Patent [19]

Kurtz et al.

[11] 4,216,404
[45] Aug. 5, 1980

[54] HOUSING AND LEAD ARRANGEMENTS FOR ELECTROMECHANICAL TRANSDUCERS

[75] Inventors: Anthony D. Kurtz, Englewood; Joseph R. Mallon, Alpine, both of N.J.

[73] Assignee: Kulite Semiconductor Products Inc., Ridgefield, N.J.

[21] Appl. No.: 29,296

[22] Filed: Apr. 12, 1979

Related U.S. Application Data

[63] Continuation of Ser. No. 926,839, Jul. 21, 1978, abandoned, which is a continuation of Ser. No. 749,692, Dec. 13, 1976, abandoned.

[51] Int. Cl.² .............................................. H01L 41/10
[52] U.S. Cl. ........................................ 310/338; 73/777; 310/324; 338/4; 338/42; 357/26
[58] Field of Search ........................ 73/774, 777, 778; 310/338, 324; 338/2-5, 42; 357/26

[56] References Cited

U.S. PATENT DOCUMENTS

| | | | |
|---|---|---|---|
| 3,325,761 | 6/1967 | McLellan | 338/42 X |
| 3,482,197 | 12/1969 | Kondo et al. | 338/42 X |
| 3,493,912 | 2/1970 | Tull et al. | 338/4 X |
| 3,568,124 | 3/1971 | Sonderegger | 338/42 X |
| 3,654,579 | 4/1972 | Kurtz et al. | 73/777 X |
| 3,739,315 | 6/1973 | Kurtz et al. | 338/3 X |
| 3,838,379 | 9/1974 | Gieles et al. | 338/42 |

*Primary Examiner*—Mark O. Budd
*Attorney, Agent, or Firm*—Arthur L. Plevy

[57] ABSTRACT

There is disclosed an electromechanical transducer of the type employing a semiconductor diaphragm. The diaphragm is associated with an active area upon which is mounted at least one force responsive element. Surrounding the active area of the diaphragm is an annular ridge which is located on a surface opposite that containing the element. A cylindrical housing having a central aperture is secured to the diaphragm on the same surface as the element and with its aperture coaxially aligned with the active diaphragm area. The aperture in the housing being larger than the aperture of the annular ridge and underlies the same to provide an exposed area about the periphery of the element's active area. This area is used for the deposition or location of terminals which are coupled to the element. The area is insensitive to applied force due to relative size of the ridge and housing and thus conducting leads attached to the terminals do not interfere with the specifications associated with the transducer.

10 Claims, 6 Drawing Figures

HOUSING AND LEAD ARRANGEMENTS FOR ELECTROMECHANICAL TRANSDUCERS

This is a continuation of application Ser. No. 926,939, filed July 21, 1978 which was a continuation of Ser. No. 749,692, filed Dec. 13, 1976, both now abandoned.

BACKGROUND OF INVENTION

This invention relates to electromechanical transducers and more particularly to a housing and diaphragm assembly for attaching leads to such a transducer without unduly affecting the operating specifications.

The use of piezoresistive transducers is well known in the prior art as well as the use of such transducers in miniature circuitry and so on.

A major problem encountered in the prior art involved the attachment of leads to the piezoresistive or semiconductor elements associated with such units. As explained in detail, in U.S. Pat. No. 3,654,379 entitled ELECTROMECHANICAL TRANSDUCERS AND HOUSINGS, issued on Apr. 4, 1972 and assigned to the assignee herein, the leads acted as lossy springs and served to affect the characteristics of the transducer in regard to the frequency of operation, hysteresis tracking ability and other characteristics as well.

Thus, the above noted patent recognized the problem of isolating the terminals from the active area of the diaphragm and thus directed the leads through suitable apertures or slots in a side wall of a housing to thereby acheive superior operating characteristics than were obtainable with prior art devices.

In the prior art, the leads were usually coupled to the strain senstive elements within the active area of the diaphragm. While the slot housing approach has found widespread utility and is a desireable way to isolate the leads from the element, there is a further need for additional means of solving this problem which would provide a more efficient and economical apparatus serving to afford such isolation. It is therefore an object of the present invention to provide an improved electromechanical transducer in conjunction with an improved housing arrangement to provide terminal and lead isolation.

BRIEF DESCRIPTION OF PREFERRED EMBODIMENT

An electromechanical transducer comprising a semiconductor member having a "U" shaped cross section with a central area between the upstanding arms of said "U" defining an active area for deflection upon application of a force thereto, said upstanding arms forming a peripheral flange about said central area, at least one force responsive element secured to said member within said central area and located on a surface opposite to that containing said peripheral flange, a longitudinal tubular housing having a central aperture of a larger diameter than said central area of said semiconductor member and an outer diameter relatively equal to that of said member, said housing secured to said member at said surface containing said element, wherein a portion of the surface of said member underlying said extending arms is exposed, terminal means located on said opposite surface of said member within said exposed portion, said means coupled to said element within said active area and conductor means coupled to said terminal means on said exposed area and directed within said central aperture of said housing.

DETAILED DESCRIPTION OF FIGURES

Figure 1:
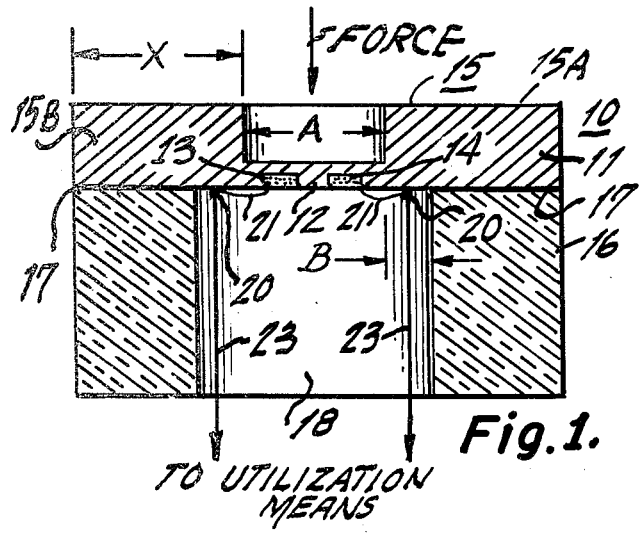
FIG. 1 is a cross-sectional view of a transducer assembly according to this invention.

Referring to FIG. 1, there is shown a transducer assembly 10. A first member 11 is fabricated from a semiconductor material such as silicon. While a side sectional view is shown, it is understood that element 11 is generally circular in shape although other geometrical configurations could be employed as well, for instance a square or hexagonal pattern may be employed for ease of fabrication.

The member 11 as depicted in FIG. 1 is of a general "U" shaped cross section. A central portion 12 of the member defines an active region. The active region 12 serves as a diaphragm and hence, will deflect upon application of a force applied thereto.

Shown located within the active region are two or more strain elements 13 and 14. The elements preferably are piezoresistive elements and may be diffused, epitaxially deposited or otherwise attached on the underside of the diaphragm portion 12 of member 11. If diffused, each of the stress sensors as 13 and 14 may be isolated from the silicon substrate by the presence of a PN junction. Although two sensors are shown, it is understood that more or less can be formed within the area 12 as in a Wheatstone bridge or some other suitable configuration.

The member 11 can be etched to form the central aperture encompassing the active area 12 of a diameter A. Such techniques for forming apertures in semiconductor materials such as silicon are well known in the state of the art.

The central area 12 thus described is bounded by an annular ridge 15 which in the cross-sectional view comprises the two upstanding arms of the "U" shaped cross section 15A and 15B. The depth of the central aperture is a function of the typical thickness desircd for the diaphragm. The thickness of the diaphragm 12 serves to determine the rated load and output for the transducer and can vary in thickness according to such specifications between 0.001" and 0.040". The diameter A can be up to an inch in diameter, but for small transducers may be on the order of fifteen to fifty mils. The effective width x of the annular ridge is dimensioned to be large enough for contact locations and clamping, as will be explained.

For example, in a typical miniature transducer, the overall diameter of member 11 may be about thirty to one hundred mils, while the diameter A may be between fifteen to fifty mils.

It is, of course, noted that the annular ridge 15 is positioned on the surface opposite to that containing the sensor elements 13 and 14.

Shown coupled to member 11 is a longitudinal cylindrical member 16. The member 16 basically is of an annular shape and may be fabricated from glass, metal or a semiconductor material and serves as a housing for the member 11. The housing 16 is bonded or secured to the member 11 by means of an epoxy, diffusion bond 17, flass frit or other means. Techniques for securing silicon, glass or metal housings as 16 to members such as 11 are known in the art.

As shown in the FIG., the member 16 has a central aperture 18 which is larger in diameter than the diameter A associated with the active area 12.

Thus, as shown, the bonded edges of member 16 underlie a substantial portion of the annular ridge 15. When member 16 is coupled to member 11 as shown, there is formed a peripheral zone of dimension B about the periphery of the active area. This zone is relatively free from deflection upon the application of forces to member 11. This is due to the fact that the effective height of the annular ridge 15 is greater than the thickness of the active area 12. This may be on the order of five to ten times greater and the stiffness varies as the cube of the thickness. Hence, the annular ridge portion of member 11 is much stiffer than the flexible diaphragm area 12.

Furthermore, the housing 16 serves to clamp a good portion of the ridge 15, as shown. Within this peripheral area or zone are deposited a plurality of terminal areas as 20. The terminal areas can be formed upon the silicon member 11 by typical metallization techniques. Such methods may employ aluminum evaportion techniques wherein aluminum is evaporated over the entire surface of the member 12 after the sensor elements as 13 and 14 have been diffused therein. Other methods as electroless plating or sputtering can also be used to form terminal areas within the peripheral area B.

Suitable conductors as 21 are directed from the sensor elements 13 and 14 to the terminal locations 20 to enable access to these elements. Output leads such as 23 are then bonded or otherwise coupled to the terminal areas 20. The leads may be soldered, ball bonded, microwelded or otherwise attached and brought out to a suitable terminal assembly or utilization means for monitoring the change in resistance of the elements 13 and 14.

It is therefore noted that the peripheral area B thus formed between the annular ridge 15 and the annular housing 16 is relatively insensitive to the application of a force to member 11 and thus, the leads 23 as directed from the terminal areas 20 do not adversely affect the operating characteristics of the transducer. The leads 23 are directed or suspended from the same surface of member 11 as containing the sensors 13 and 14. The apparatus thus permits an easy and economical placement of such leads without the necessity of forming slots or apertures in a housing as 16.

Due to the fact that the terminals 20 and the leads are positioned within the peripheral area B, they do not act as lossy springs which would undesireably effect the operating characteristics of the resultant transducer.

Figure 2:
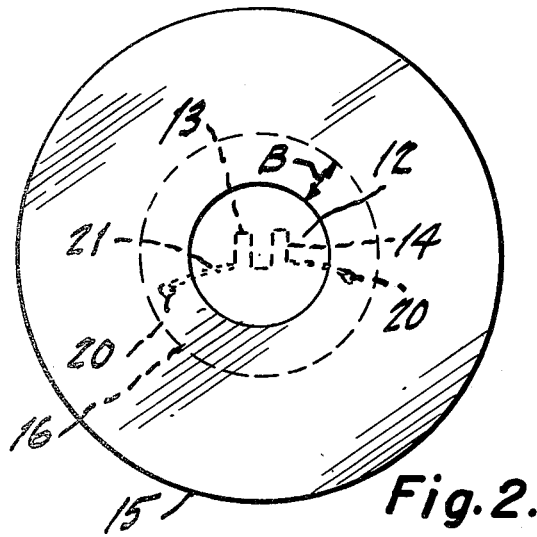
FIG. 2 is a top plan view of the transducer of FIG. 1.

In FIG. 2, there is shown a top view of the apparatus thus depicted. The peripheral area B is shown as formed between the housing 16 and the ridge 15. The terminals 20 as indicated are deposited and located within this zone or area surrounding the active area 12.

It is also noted that the active area 12 is relatively coaxial with the aperture of the housing 16 and hence, the peripheral area B is also coaxial with the active area 12. As can be seen from the figures, the sensing elements are positioned on the same surface as the terminal areas 20 and leads 21 and hence, the sensors as well as the terminals are relatively isolated from the force transmitting environment. This also applies to the output leads 23 which are contained solely within the aperture 18 of the housing 16. The leads 23 are shown directed through aperture 18 to a utilization means, but may be connected to a suitable terminal assembly.

Figure 3:
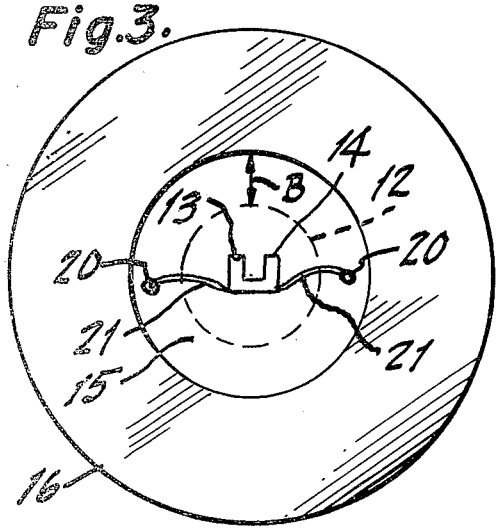
FIG. 3 is a bottom plan view of the transducer.

FIG. 3 depicts a bottom view showing the sensing elements located within the active area with the terminal assemblies 20 positioned within the peripheral area of the dimension.

Figure 4:
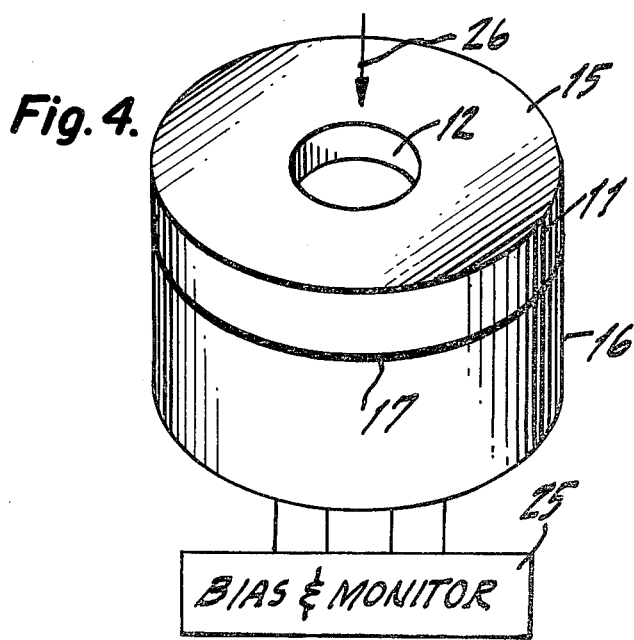
FIG. 4 is a perspective view of a transducer according to this invention.

FIG. 4 shows a perspective view of a transducer as described above with the output leads directed to a bias and monitor source 25. It is noted that the area 12 which defines the active diaphragm area is substantially less than the overall diameter of member 11 to assure that the effective width and height of the ridge 15 mechanically isolates the peripheral area B from forces applied to the assembly in the direction of Arrow 26.

Figure 5:
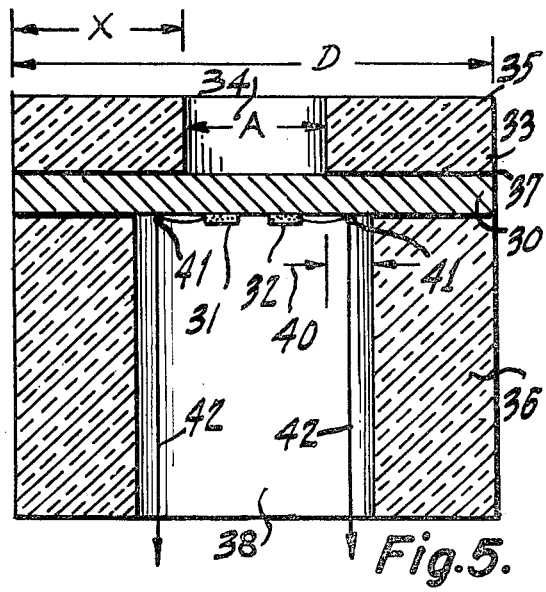
FIG. 5 is a side sectional view of an alternate embodiment of a transducer according to this invention.

In FIG. 5, a thin diaphragm 30 which may be fabricated from a thin disk of mono-crystalline silicon, has diffused or located thereon in a central area, sensors 31 and 32. As briefly indicated, the sensors can be emplaced upon the diaphragm 30 by means of a diffusion, epitaxial growth or other technique. The diaphragm is then bonded to an annular ring member 33 having a central aperture 34.

The central aperture of the annular ring 33 defines the dimension A of the active area of the diaphragm, while the overall diameter of the ring 33 determines the width x of the peripheral ridge 35 bonded to the sensor.

The annular ring 33 is bonded to the diaphragm 30 by means of an epoxy, glass or other bonding means 37 and basically, the aperture 34 is coaxial with the central active area of the diaphragm 30 bonded to the sensor.

Coupled to the diaphragm 30 on the same surface containing the sensors 31 and 32 is the annular housing 36. The housing 36 has a central aperture 38 which is coaxial with aperture 34 and is of a greater diameter. Thus, there is formed a peripheral area 40 about the active area, which peripheral area 40 accommodates terminals as 41. The terminals 41 are coupled by means of metallization or otherwise to the sensing elements 31 and 32.

Output leads as 42 are ball bonded, soldered, or otherwise coupled to the terminal areas 41 in area 40 which as described above, is similar in function to area B of FIG. 1 and hence, does not respond to or otherwise effect the sensors when leads as 42 are coupled thereto.

Thus, the configurations shown serve to mechanically isolate wires from the transducer assembly to obtain advantages in regard to the overall operating characteristics of the transducer resulting in improved frequency operation, hysteresis characteristics and so on.

Figure 6:
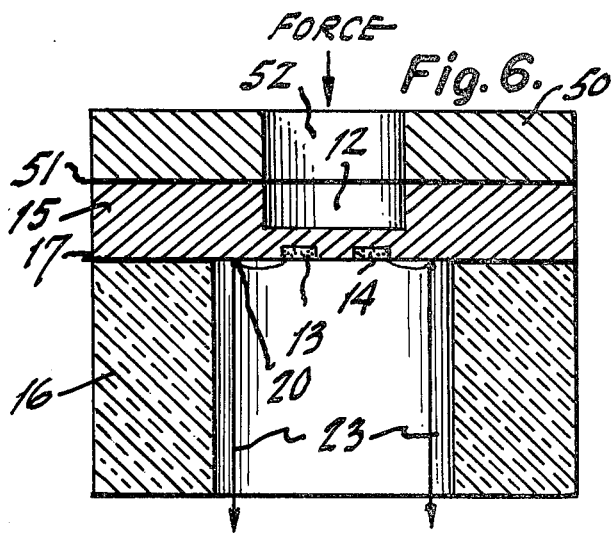
FIG. 6 is a cross-sectional view of an alternate embodiment.

FIG. 6 shows a transducer arrangement as that depicted in FIG. 1. The integral "U" shaped cross-sectional member 11 has an additional annular ring 50 bonded to it. The ring 50 has a central aperture 52 coaxial with the active area 12 of the member 11. The additional ring 50 may be employed to provide even greater stiffness to the annular ridge portion to further assure that the terminal areas 20 are free from deflection upon application of a force to the assembly. The ring 50 may be bonded to the member 11 by means of a diffusion, epoxy or glass frit bond 51. The ring 50 may be fabricated from a semiconductor material such as silicon or a glass and so on. A diffusion bond 51 can be formed between member 11 and member 50 if fabricated from glass by holding the members 11 and 50 in close contact and under pressure applying a voltage to cause glass from 50 to diffuse into the silicon member 11 to bond the same thereto. Similar techniques as described above can be employed to couple the housing 16 to the member 11.

The glass selected for these applications preferably possesses a matching thermal coefficient with the semiconductor material of member 11 to allow for thermal tracking of characteristics due to changes in environmental temperatures and as such, many suitable and known types of glass exist and are available. Such glass can be employed in formulating diffusion bonds between the various component parts as described above.

Although specific dimensions are given in the specification for describing small transducers, it is understood that the techniques depicted have applicability in general, and hence any size transducer could employ the advantages of the structure depicted in this application.

We claim:

1. An electromechanical transducer comprising:
   (a) a semiconductor diaphragm member having a "U" shaped cross section with a central area between the upstanding arms of said "U" defining an active area for deflection upon application of a force thereto, said upstanding arms forming a peripheral flange about said central area, with the height of said arms being five to ten times greater than the width of said active area whereby upon application of a force to said diaphragm member, said upstanding arms will not deflect,
   (b) at least one piezoresistive element secured to said member within said central area and located on a surface opposite to that containing said peripheral flange,
   (c) a longitudinal tubular housing fabricated from glass having a central aperture of a larger diameter than said central area of said diaphragm member and an outer diameter relatively equal to that of said member, said housing secured to said member at said surface containing said element, wherein a portion of the surface of said member underlying said upstanding arms is exposed, with said portion as underlying said arms being relatively insensitive to deflection upon application of said force,
   (d) terminal means located on said opposite surface of said member within said exposed portion, said means coupled to said element within said active area, and
   (e) conductor means coupled to said terminal means on said exposed area and directed within said central aperture of said housing.

2. The electromechanical transducer according to claim 1 wherein said diaphragm member is fabricated from an integral piece of silicon.

3. The electromechanical transducer according to claim 1 wherein there is a diffusion bond between said glass housing and said diaphragm member.

4. The electromechanical transducer according to claim 1 wherein said active area of said member is between fifteen to fifty mils with said outer diameter of said member between thirty to one hundred mils.

5. The electromechanical transducer according to claim 1 further comprising an annular ring secured to said member about said peripheral flange, said ring having an inner diameter relatively congruent with said active area.

6. The electromechanical transducer according to claim 5 wherein said ring is fabricated from glass and is secured to said member by a diffusion bond.

7. An electromechanical transducer comprising:
   (a) a relatively thin silicon diaphragm of a given diameter,
   (b) a first annular ring of an outer diameter relatively equal to said diaphragm diameter, and an inner diameter substantially less than said diaphragm diameter, said ring secured to said diaphragm to form a composite member of a "U" shaped cross section with the area of said diaphragm between said extending arms of said "U" member as formed by said annular ring defining an active deflection area for said diaphragm,
   (c) at least one piezoresistive element secured to said diaphragm within said active area and on the surface opposite to that containing said first ring,
   (d) a second annular glass member of an outer diameter relatively equal to said diaphragm diameter and of an inner diameter greater than said inner diameter of said ring, said second member secured to said diaphragm about said surface containing said element with said inner diameter aperture of said member relatively coaxial with said inner diameter aperture of said ring, to provide a peripheral area on the surface of said diaphragm containing said element which underlies a portion of said extending arms of said annular ring, with said peripheral area being relatively insensitive to deflection compared to said active area,
   (e) a third annular ring relatively congruent to said first ring and bonded thereto to provide greater stiffness to said transducer, whereby the thickness of said first and third rings is between five to ten times greater than the thickness of said diaphragm to assure that said peripheral area will not deflect upon application of a force to said transducer,
   (f) terminal means located on said element surface positioned within said peripheral area, said means coupled to said force responsive element, and
   (g) at least one conductor coupled to said terminal means and directed through said inner diameter aperture of said ring.

8. The transducer according to claim 7 wherein the outer diameter of said annular ring and therefore said diaphragm is between thirty to one hundred mils, with the inner diameter being between fifteen to fifty mils.

9. The electromechanical transducer according to claim 7 wherein said first annular ring is fabricated from silicon.

10. The transducer according to claim 7 wherein said first annular ring is bonded to said diaphragm by means of a glass bond.

* * * * *